(12) United States Patent
Kwon

(10) Patent No.: US 6,780,774 B2
(45) Date of Patent: Aug. 24, 2004

(54) METHOD OF SEMICONDUCTOR DEVICE ISOLATION

(75) Inventor: Jae Soon Kwon, Chungcheogbuk-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 207 days.

(21) Appl. No.: 10/023,861

(22) Filed: Dec. 21, 2001

(65) Prior Publication Data

US 2003/0064597 A1 Apr. 3, 2003

(30) Foreign Application Priority Data

Sep. 28, 2001 (KR) ........................................ 2001-60631

(51) Int. Cl.[7] .............................................. H01L 21/302
(52) U.S. Cl. ...................... 438/694; 438/696; 438/697; 438/699; 438/700; 438/705
(58) Field of Search ................................ 438/694, 696, 438/697, 699, 700, 705

(56) References Cited

U.S. PATENT DOCUMENTS

| 5,721,673 A | | 2/1998 | Klein | |
| 5,960,299 A | * | 9/1999 | Yew et al. | 438/424 |
| 5,994,756 A | | 11/1999 | Umezawa et al. | |
| 6,093,614 A | | 7/2000 | Gruening et al. | |
| 6,306,723 B1 | * | 10/2001 | Chen et al. | 438/429 |
| 6,350,662 B1 | * | 2/2002 | Thei et al. | 438/435 |

FOREIGN PATENT DOCUMENTS

| JP | 04-014829 | 1/1992 | ....... H01L/21/3205 |
| JP | 04-134844 | 5/1992 | ........... H01L/21/76 |
| JP | 06-001190 | 1/1994 | ........... B60R/21/16 |
| JP | 09-036323 | 2/1997 | ......... H01L/27/108 |
| JP | 10-144780 | 5/1998 | ........... H01L/21/76 |

* cited by examiner

Primary Examiner—Nadine G. Norton
Assistant Examiner—Binh X Tran
(74) Attorney, Agent, or Firm—Jacobson Holman PLLC

(57) ABSTRACT

Disclosed herein is a method of semiconductor device isolation, which forms a device isolation film on an isolation region of a substrate using a trench process. The method comprises the steps of providing a semiconductor substrate where a device isolation region was defined; forming a mask on the substrate in such a manner that the device isolation region is exposed through the mask; etching the substrate using the mask to form a trench; thermally treating an inner wall of the trench using the mask under a hydrogen atmosphere; forming a first insulating layer covering the resulting inner wall of the trench; forming a second insulating layer on the mask in such a manner that the second insulating film covers the first insulating film; firstly etching the second insulating layer to expose a surface of the mask; removing the mask; secondly etching the remaining second insulating layer until a surface of the substrate is exposed, thereby forming a device isolation film.

6 Claims, 8 Drawing Sheets

METHOD OF SEMICONDUCTOR DEVICE ISOLATION

BACKGROUND OF THE INVENTION

1. Field of the Invention

The present invention relates generally to a method of semiconductor device isolation, and more particularly to a method of semiconductor device isolation, which can form a device isolation film on an isolation region of a substrate using a Shallow Trench Isolation (STI) process.

2. Description of the Prior Art

Semiconductor devices formed on a silicon wafer includes a device isolation region serving to electrically isolate circuit patterns from each other. The formation of the device isolation region is an initial process in all fabrication processes, and has an influence upon a size of active regions and a process margin in the subsequent processes. Thus, as the semiconductor devices are highly integrated and fines down, there are actively conducted studies to reduce a size of the respective devices and also to reduce the device isolation region.

Generally, the LOCOS device isolation method widely used in fabrication of semiconductor devices is advantageous in that a process is simple. In a highly integrated semiconductor device of the 256 M DRAM level or above, however, the LOCOS method has limitations due to punch-through by the bird's beak resulted from a reduction in width of the device isolation region, as well as a reduction in thickness of a device isolation film.

For this reason, device isolation methods using a trench, such as the Shallow Trench Isolation (STI), were proposed as technologies suitable for device isolation in the highly integrated semiconductor devices.

FIGS. 1a to 1d show a method of semiconductor device isolation according to the prior art.

As shown in FIG. 1a, a pad oxide film 102 serving as a buffer film and a silicon nitride film 104 serving to inhibit oxidation are successively formed all over the surface of a semiconductor substrate 100 where a device region II and an isolation region I were defined.

Thereafter, a photoresist film is applied on the silicon nitride film 104, and then exposed to light and developed, thereby forming a photoresist pattern (PR) 108 through which the isolation region I is exposed.

Next, as shown in FIG. 1b, the silicon oxide film, the pad oxide film and the substrate are etched to a selected depth to form a shallow trench 110. Then, the photoresist pattern is removed.

After this, in order to recover from surface defects (not shown) caused upon the etching for formation of the trench, the substrate 100 where the trench 110 was formed is subjected to a thermal oxidation process to form a thermal oxide film (not shown) on the substrate. The thermal oxide film is then removed.

Subsequently, as shown in FIG. 1c, on the resulting substrate is formed a gap-fill oxide film 120 filled in the trench 110. As shown in FIG. 1d, the gap-fill oxide film is etched and planarized using a Chemical Mechanical Polishing (CMP) process in such a manner that the silicon nitride film is exposed.

At the same time, an adhesive oxide film (not shown) may also be interposed between the silicon nitride film 104 and the gap-fill oxide film 120 such that an adhesive strength between the silicon nitride film 104 and the gap-fill oxide film can be increased. The gap-fill oxide film remaining within the trench 120 becomes a device isolation film 121.

Then, the remaining silicon oxide film and pad oxide film are removed in sequence. Thereafter, a polycrystalline silicon layer 130 for formation of a gate is formed on the resulting substrate.

FIGS. 2, 3 and 4 are cross-sectional and plane views that show drawbacks occurring in the prior art.

In the method according to the prior art, through forming and removing steps of the thermal oxide film carried out for the purpose of recovering the surface of the substrate having the trench from the defects, a width of the trench is widen so as to reduce a device region, as shown in FIG. 2. Also, in the subsequent gap-fill oxide deposition and CMP processes and further cleaning process, the upper edge of the trench is recessed as shown by a in FIG. 3, and the recessed portion a has a high etching rate.

In addition, in the deposition and patterning processes of the polycrystalline silicon layer for formation of the gate, the polycrystalline silicon remains on the recessed portion a. For this reason, as shown in FIG. 4, shorts 1 are caused between word lines 130 on a device region 140.

SUMMARY OF THE INVENTION

Accordingly, the present invention has been made to solve the above-mentioned problems occurring in the prior art, and an object of the present invention is to provide a method of semiconductor device isolation, which can easily recover the substrate from the surface defects caused upon the substrate etching process for formation of the trench, while being able to prevent the upper edge portion of the trench from being recessed.

To accomplish this object, there is provided a method of semiconductor device isolation, comprising the steps of providing a semiconductor substrate where a device isolation region was defined; forming a mask on the substrate in such a manner that the device isolation region is exposed through the mask; etching the substrate using the mask to form a trench; thermally treating an inner wall of the trench using the mask under a hydrogen atmosphere; forming a first insulating layer covering the inner wall of the trench; forming a second insulating layer on the mask in such a manner that the second insulating film covers the first insulating film; firstly etching the second insulating layer to expose a surface of the mask; removing the mask; secondly etching the remaining second insulating layer until a surface of the substrate is exposed, thereby forming a device isolation film.

Also, in another embodiment, there is provided a method of semiconductor device isolation, which comprises the steps of providing a semiconductor substrate where a device isolation region was defined; successively forming a buffer oxide film and a silicon nitride film on the substrate; forming a photoresist pattern on the silicon nitride film in such a manner that the device isolation region is exposed through the photoresist pattern; etching the silicon nitride film, the pad oxide film and the substrate using the photoresist pattern as a mask to form a trench; removing the photoresist pattern; thermally treating an inner wall of the trench under a hydrogen atmosphere using the remaining silicon nitride film as a mask; forming an epi-layer covering the resulting inner wall of the trench; forming an insulating layer on the remaining silicon nitride film in such a manner that the insulating layer covers the epi-layer; firstly etching the insulating layer to expose a surface of the remaining silicon nitride film; removing the remaining silicon nitride film; secondly etching the remaining insulating layer until a surface of the substrate is exposed, thereby forming a device isolation film.

BRIEF DESCRIPTION OF THE DRAWINGS

The above and other objects, features and advantages of the present invention will be more apparent from the following detailed description taken in conjunction with the accompanying drawings, in which:

FIGS. 2, 3 and 4 are cross-sectional and plane views showing drawbacks with the prior art.

DETAILED DESCRIPTION OF THE PREFERRED EMBODIMENTS

Hereinafter, a preferred embodiment of the present invention will be described in detail with reference to the accompanying drawings.

FIGS. 5a to 5g are cross-sectional views showing a method of semiconductor device isolation according to the present invention.

Figure 1A:
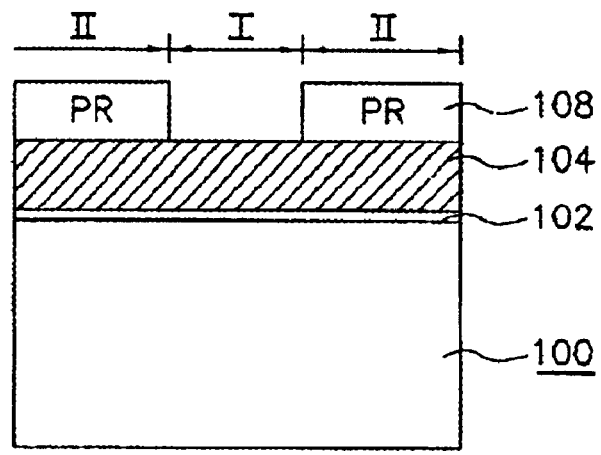
FIGS. 1 to 4 are cross-sectional views showing a method of semiconductor device isolation according to the prior art.
Figure 1B:
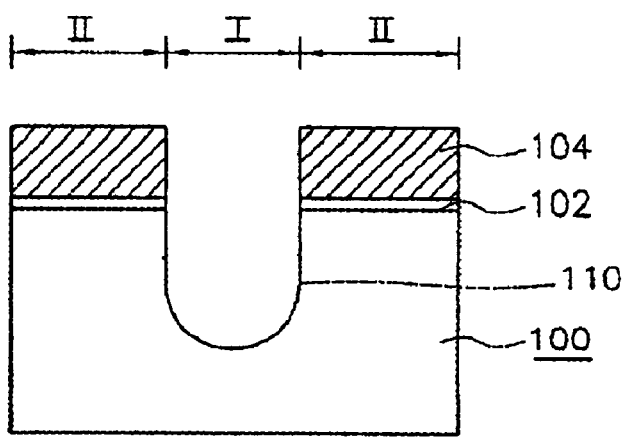
Figure 1C:
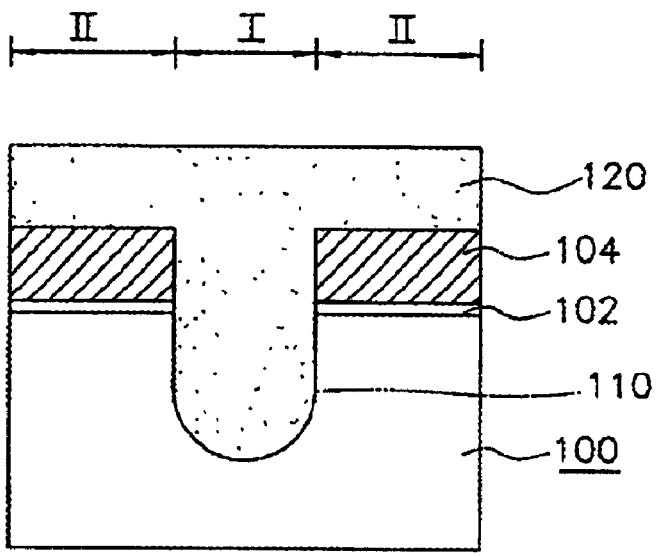
Figure 1D:
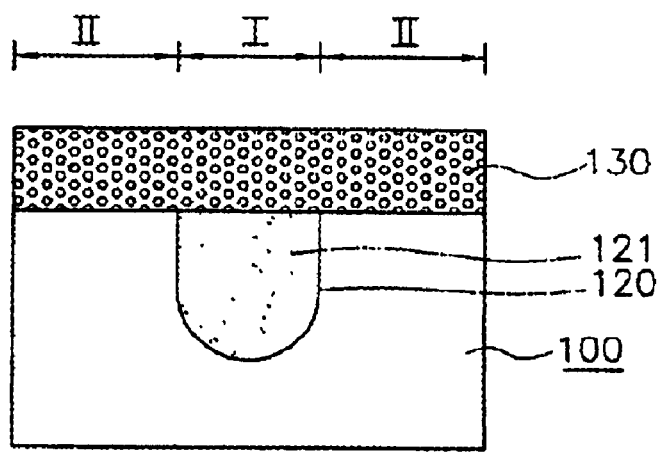
Figure 2:
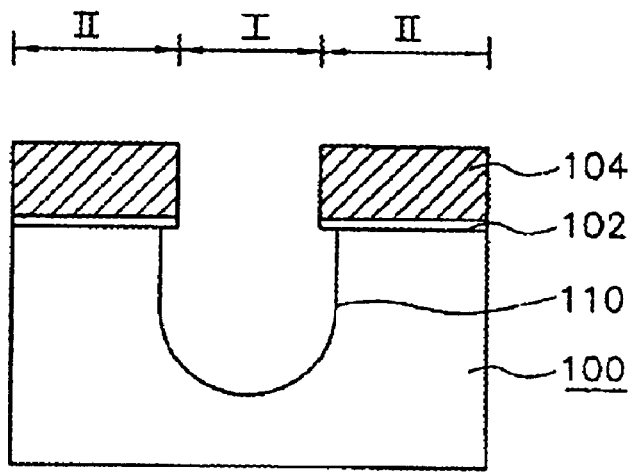
Figure 3:
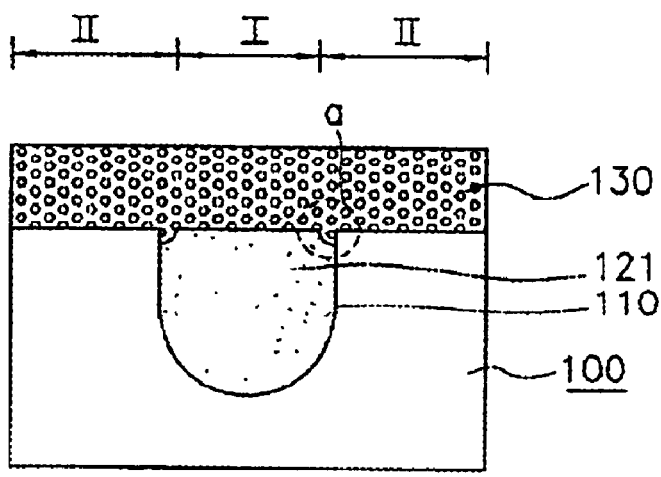
Figure 4:
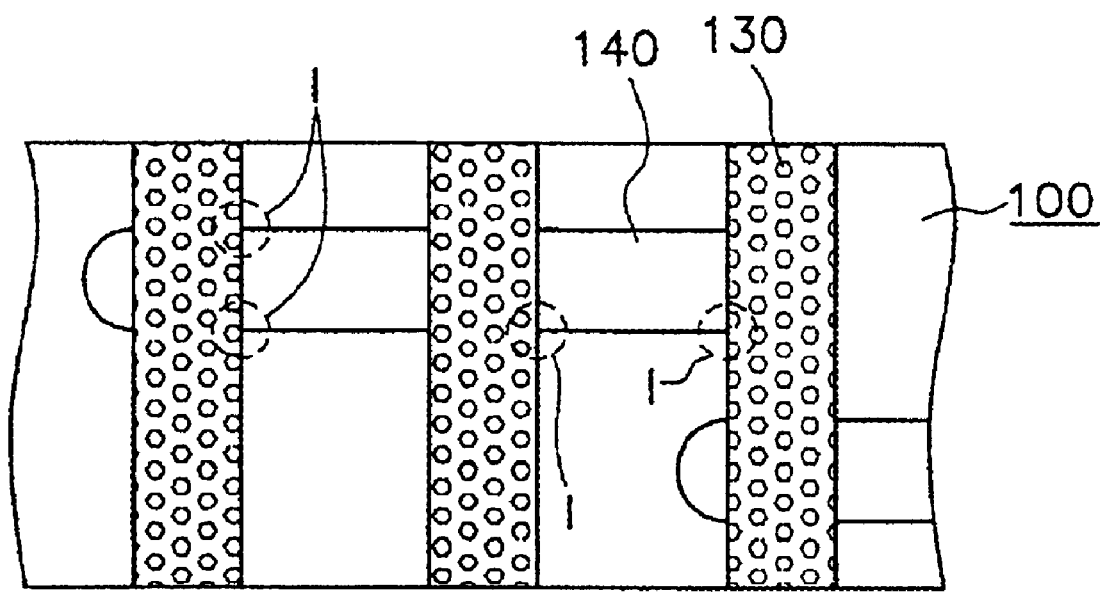
Figure 5A:
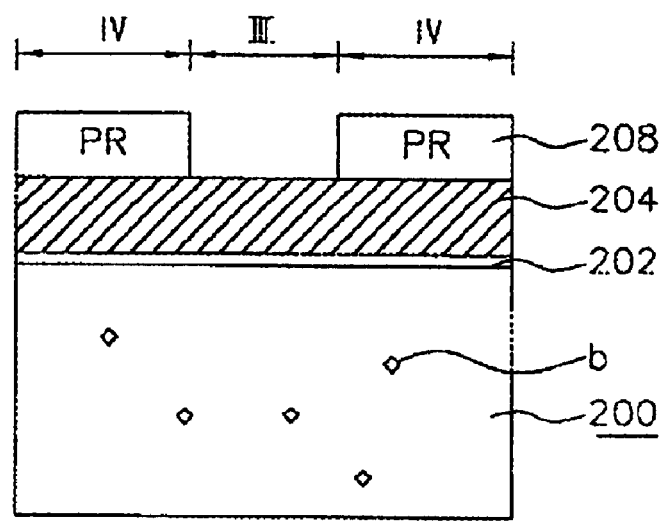
FIGS. 5a to 5g are cross-sectional views showing a method of semiconductor device isolation according to the present invention.

As shown in FIG. 5a, the method of semiconductor device isolation of the present invention includes successively forming a pad oxide film 202, a buffer film, and a non-oxidized silicon nitride film 204 all over a semiconductor substrate 200 using a chemical vapor deposition process. The semiconductor device has a device region IV and an isolation region III defined therein.

Thereafter, a photoresist film is applied on the silicon nitride film 204, exposed to a light and developed, so that a photoresist pattern (PR) 208 is formed which covers the device region IV and exposes the isolation region III.

Figure 5B:
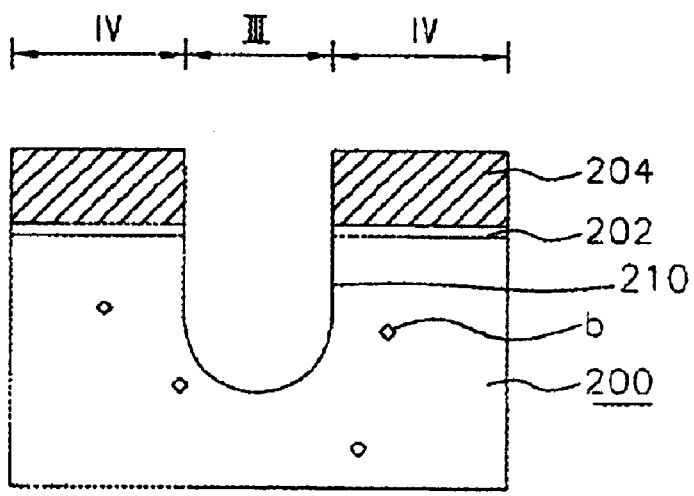

Next, as shown in FIG. 5b, the silicon nitride film, the pad oxide film and the substrate are etched to a desired depth by a dry etching process using the photoresist pattern 208 as a mask, thereby forming a shallow trench 210. Then, the photoresist pattern is removed.

Figure 5C:
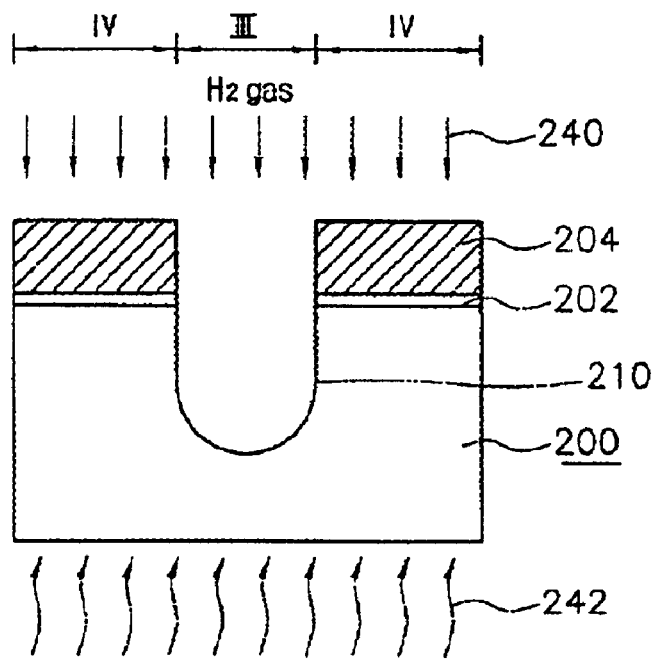

After this, as shown in FIG. 5c, the substrate having the formed trench 210 is supplied with hydrogen gas and subjected to a thermal treatment process at a temperature of 600° C. to 1300° C.

At this time, where the substrate having the formed trench is subjected to the thermal treatment process, crystal defects caused by the growth ingot for the silicon substrate 200, especially crystal-originated particles (COP) (b), can be mitigated so as to reduce junction leakage, thereby protecting the silicon substrate.

$$2H_2 + SiO_2 \rightarrow H_2O\uparrow + Si \qquad (a)$$

In other words, as the surface of COP is formed of unstable Si—O bonds, $H_2$ is diffused so as to remove the Si—O bonds at the surface of COP(b) according to a mechanism according to the reaction formula (a) as indicated above. Then, Si is migrated and thus the COP defects are disappeared.

Figure 5D:
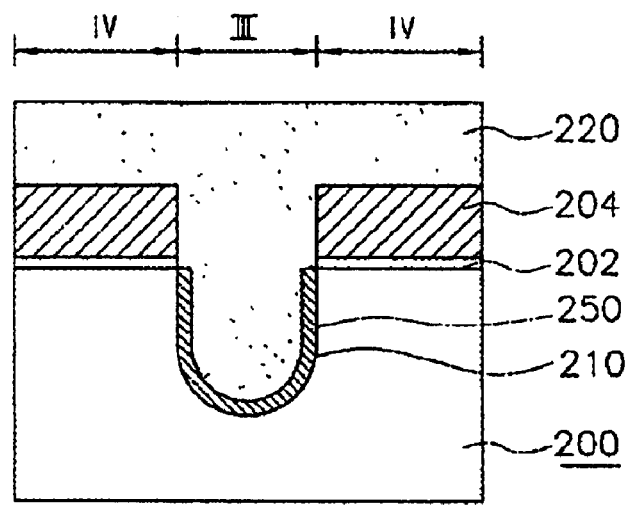

After the surface of the silicon substrate is stabilized by processes of the hydrogen gas supply 240 and the thermal treatment 242, the surface of the trench is subjected to selective silicon epitaxial growth to form an insulating layer 250 as shown FIG. 5d.

By the selective silicon epitaxial growth, etching damage of the silicon substrate can be mitigated so as to reduce junction leakage, thereby protecting the silicon substrate.

Figure 5E:
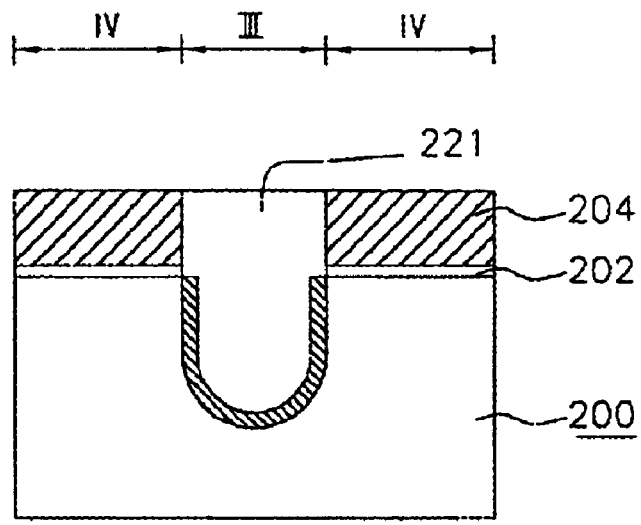

Thereafter, on the resulting substrate is formed a gap-fill oxide film 220 filled in the trench 250 having the formed insulating layer 250. Then, as shown in FIG. 5e, the gap-fill oxide film 220 is firstly etched using the CMP process in such a manner that the silicon nitride film 204 is exposed.

At this time, an adhesive oxide film (not shown) may also be interposed between the silicon nitride film 204 and the gap-fill oxide film 220 such that an adhesive strength between the silicon nitride film 204 and the gap-fill oxide film 220 can be increased. The reference numeral 221 denotes a gap-fill oxide film remaining after the etching process.

Figure 5F:
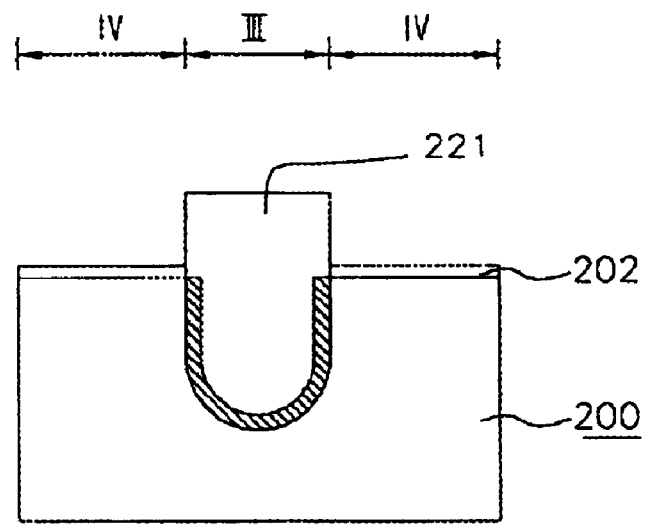

Then, as shown in FIG. 5f, the silicon nitride film is removed.

Figure 5G:
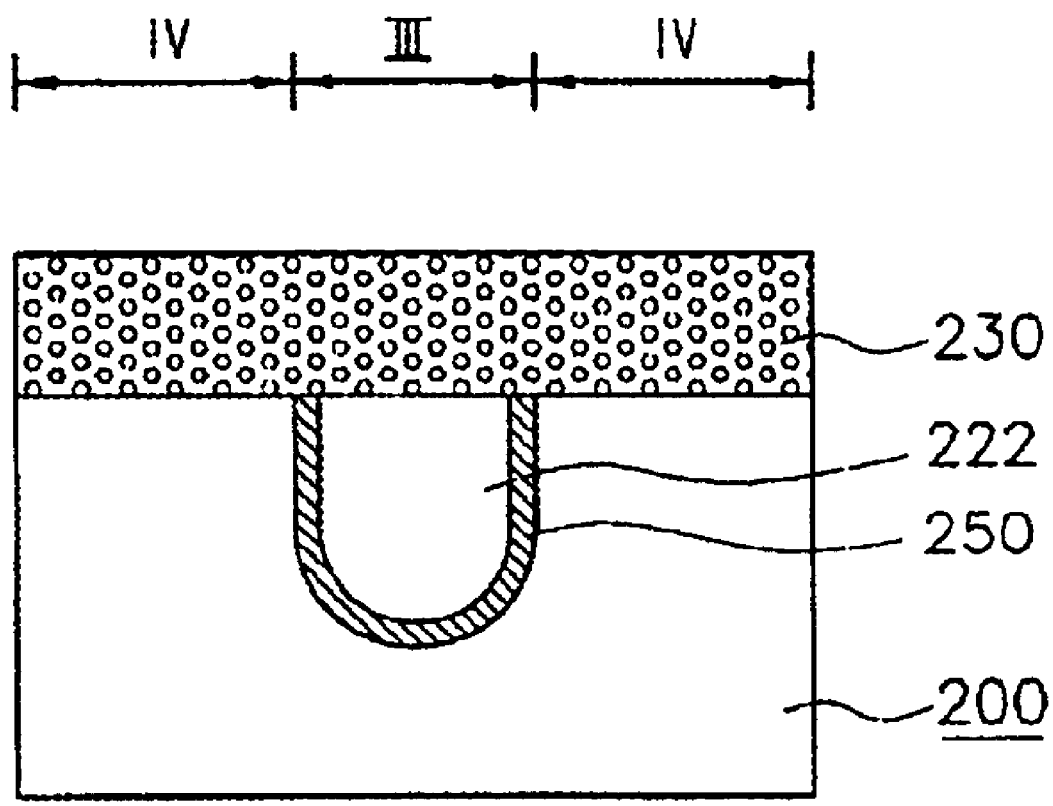

Next, as shown in FIG. 5g, the remaining gap-fill oxide film is secondly etched until the surface of the substrate is exposed, thereby forming a device isolation film 222. At this time, the device isolation film 222 is formed of a gap-fill oxide film remaining after the first and second etching processes and the insulating layer 250.

Then, a polycrystalline silicon layer 230 is deposited on the resulting substrate structure, and patterned to form a gate (not shown).

As described above, the method of the present invention includes thermally treating the inside of the trench under a hydrogen gas atmosphere. Thus, through migration of silicon, the substrate can recover from the surface defects caused upon the etching process for formation of the trench.

In addition, silicon below the silicon nitride film is grown by selective silicon epitaxial growth to have a protruded shape. Thus, the upper edge portion of the trench is not recessed even when the subsequent processes for the insulating film deposition and the device isolation using the CMP process are completed.

Accordingly, the method of the present invention does not cause formation of the recess at the upper portion of the shallow trench and thus does not cause shorts between word lines. As a result, the method of the present invention is suitable for fabrication of highly reliable devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of semiconductor device isolation, which comprises the steps of:
   providing a semiconductor substrate where a device isolation region was defined;
   forming a mask on the substrate in such a manner that the device isolation region is exposed through the mask;
   etching the substrate using the mask to form a trench;
   thermally treating an inner wall of the trench using the mask under a hydrogen atmosphere;
   forming a first insulating layer covering the resulting inner wall of the trench, wherein the first insulating layer is formed using an epitaxial growth process;
   forming a second insulating layer on the mask in such a manner that the second insulating film covers the first insulating film;
   firstly etching the second insulating layer to expose a surface of the mask;

removing the mask;

secondly etching the remaining second insulating, layer until a surface of the substrate is exposed, thereby forming a device isolation film.

2. The method of claim 1, in which the thermal treatment is carried out at a temperature of 600° C. to 1300° C.

3. The method of claim 1, in which the first and second etching steps for the second insulating layer are carried out using a chemical mechanical polishing (CMP) process or an etch back process.

4. A method of semiconductor device isolation, which comprises the steps of:

providing a semiconductor substrate where a device isolation region was defined;

successively forming a buffer oxide film and a silicon nitride film on the substrate;

forming a photoresist pattern on the silicon nitride film in such a manner that the device isolation region is exposed through the photoresist pattern;

etching the silicon nitride film, the pad oxide film and the substrate using the photoresist pattern as a mask to form a trench;

removing the photoresist pattern;

thermally treating an inner wall of the trench under a hydrogen atmosphere using the remaining silicon nitride film as a mask;

forming an epitaxial layer covering the resulting inner wall of the trench;

forming an insulating layer on the remaining silicon nitride film in such a manner that the insulating layer covers the epitaxial layer;

firstly etching the insulating layer to expose a surface of the remaining silicon nitride film;

removing the remaining silicon nitride film;

secondly etching the remaining insulating layer until a surface of the substrate is exposed, thereby forming a device isolation film.

5. The method of claim 4, in which the thermal treatment is carried out at a temperature of 600° C. to 1300° C.

6. The method of claim 4, in which the first and second etching steps for the insulating layer are carried out using a chemical mechanical polishing (CMP) process or an etch back process.

* * * * *